US005688556A

United States Patent [19]

Wagner, Jr.

[11] Patent Number: 5,688,556
[45] Date of Patent: Nov. 18, 1997

[54] BARRIER FILMS HAVING VAPOR COATED EVOH SURFACES

[75] Inventor: John R. Wagner, Jr., Rochester, N.Y.

[73] Assignee: Mobil Oil Corporation, Fairfax, Va.

[21] Appl. No.: 625,129

[22] Filed: Apr. 1, 1996

Related U.S. Application Data

[60] Continuation-in-part of Ser. No. 528,803, Sep. 15, 1995, which is a division of Ser. No. 221,620, Apr. 1, 1994, abandoned.

[51] Int. Cl.$^6$ .............. B32B 33/00; B32B 9/00
[52] U.S. Cl. .......... 427/248.1; 427/249; 427/255.1; 427/255.3; 427/255.6; 427/569; 427/576; 427/577; 427/579
[58] Field of Search .................. 427/569, 576, 427/577, 579; 428/248.1, 249, 255.1, 255.3, 255.6

[56] References Cited

U.S. PATENT DOCUMENTS

| | | | |
|---|---|---|---|
| 3,663,265 | 5/1972 | Lee et al. | 117/93.1 |
| 4,365,587 | 12/1982 | Hirose et al. | 118/723 |
| 4,561,920 | 12/1985 | Foster | 156/244.11 |
| 4,663,183 | 5/1987 | Ovshinsky et al. | 427/39 |
| 4,675,206 | 6/1987 | Ikegaya et al. | 477/38 |
| 4,756,964 | 7/1988 | Kincaid et al. | 428/408 |
| 4,824,699 | 4/1989 | Woo et al. | 427/307 |
| 4,863,549 | 9/1989 | Grünwald | 156/345 |
| 4,902,378 | 2/1990 | Ouderkirk et al. | 156/643 |
| 5,000,831 | 3/1991 | Osawa et al. | 204/173 |
| 5,041,201 | 8/1991 | Yamazaki et al. | 204/192.32 |
| 5,079,033 | 1/1992 | Schulz et al. | 427/44 |
| 5,084,356 | 1/1992 | Deak et al. | 428/458 |
| 5,085,904 | 2/1992 | Deak et al. | 428/357 |
| 5,137,780 | 8/1992 | Nichols et al. | 428/336 |
| 5,230,931 | 7/1993 | Yamazaki et al. | 427/569 |

*Primary Examiner*—Ana Woodward
*Attorney, Agent, or Firm*—Dennis P. Santini

[57] ABSTRACT

A method of producing a multilayer polymeric film is accomplished through the vapor deposition of a barrier coating onto an ethylene vinyl alcohol copolymer layer, which is adhered to a polymeric substrate. A multilayer polymeric film exhibiting barrier characteristics is also accomplished through the use of an ethylene vinyl alcohol copolymer layer between a vapor deposited barrier coating and a polymeric substrate.

13 Claims, No Drawings

BARRIER FILMS HAVING VAPOR COATED EVOH SURFACES

This application is a continuation-in-part of U.S. Ser. No. 08/528,803, filed Sep. 15, 1995, which in turn is a division of U.S. Ser. No. 08/291,620, filed Apr. 1, 1994, now abandoned.

BACKGROUND OF THE INVENTION

The present invention relates to barrier films and, in particular, to barrier films having at least one exposed high energy surface for receipt of a barrier coating through vapor deposition of a barrier coating material.

Coatings produced by vapor deposition are known to provide certain barrier characteristics to the coated substrate. For example, an organic coating such as a amorphous carbon can inhibit the transmission of elements such as water, oxygen, and carbon dioxide. Accordingly, carbon coatings have been applied to substrates (e.g., polymeric films) to improve the barrier characteristics exhibited by the substrate. Thus, the vapor deposited coating is often referred to as a barrier coating.

Another example of coatings applied to substrates to improve their barrier characteristics are coatings of inorganic materials, such as inorganic oxides. Oxides of silicon and aluminum are widely utilized to improve the barrier characteristics of substrates, especially polymeric substrates. Oxides of silicon and aluminum also provide abrasion resistance due to their glass-like nature.

The above-described coatings can be deposited on substrates through various techniques of vapor deposition. Typically vapor deposition techniques can be classified as either physical vapor deposition (PVD) or as chemical vapor deposition (CVD). Examples of PVD processes include ion beam sputtering and thermal evaporation. Examples of CVD processes include glow discharge and Plasma Enhanced Chemical Vapor Deposition (PECVD).

Of these techniques, PECVD is becoming widely utilized, in part, because it enables the coating of temperature sensitive substrates, such as polymeric films. Particularly, this technique allows the deposition of a coating material at lower reaction chamber temperatures, as compared to the reaction chamber temperatures required in other deposition processes, e.g., glow discharge and more so, ion beam sputtering. As a result of the lower reaction chamber temperatures, temperature-sensitive substrates can be coated, which might otherwise be detrimentally affected by the higher reaction chamber temperatures found in the other coating processes.

The PECVD process is, however, a relatively slow and lengthy process, which in many cases renders such technique commercially impracticable. Accordingly, there exists a need in the art for a method that increases the rate of production of a barrier film utilizing PECVD, while at the same time maintaining the desirable barrier properties exhibited by the coated substrate.

There is also a continuing need in the art to provide barrier films with increased barrier characteristics. Accordingly, it is an object of the present invention to provide barrier films with improved barrier characteristics and a method of making the same.

SUMMARY OF THE INVENTION

The present invention, which addresses the needs of the prior art, provides a method for producing a polymeric film having barrier characteristics. The method includes the step of vapor depositing a barrier coating on an exposed surface of an ethylene vinyl alcohol layer which is adhered to a polymeric substrate.

The polymeric substrate can be any polymeric substrate as long as its compatible with the ethylene vinyl alcohol layer. Preferred polymeric substrates include polypropylene, polyethylene, biaxial nylon and polyester.

The barrier coating can be an organic or inorganic coating. Preferred inorganic oxide coatings include oxides of silicon and aluminum, and more specifically, $SiO_x$, in which x is $1 \leq x \leq 2$, $Al_2O_3$ and mixtures thereof. Preferred organic coatings include amorphous carbon.

The present invention also provides a method for increasing the production rate of a barrier film. The method includes the step of adhering an ethylene vinyl alcohol layer to a polymeric substrate and thereafter vapor depositing a barrier coating on the exposed surface of the ethylene vinyl alcohol layer. A preferred technique of adhering the ethylene vinyl alcohol layer to the polymeric substrate is through coextrusion.

The present invention also provides a multilayer polymeric film having barrier characteristics. The film has a polymeric substrate with an ethylene vinyl alcohol layer on one side of the polymeric substrate. A barrier coating is situated on the outside surface of the ethylene vinyl alcohol layer, i.e., the side opposite from the polymeric substrate. The barrier coating preferably has a thickness from about 10 to 5000 angstroms.

As a result of the present invention, the time required to produce a polymeric film having a vapor deposited barrier coating is greatly reduced, and thereby increases the commercial practicality of PECVD techniques. Moreover, the present invention provides a method of making a polymeric film having an improved barrier to the transmission of water and atmospheric gases when the coating time remains the same. Accordingly, the barrier films of the present invention provide improved impermeability to the elements such as water and atmospheric gases.

DETAILED DESCRIPTION OF THE INVENTION

In accordance with the present invention, a method is provided for producing a polymeric film having barrier characteristics. The method includes the step of vapor depositing a barrier coating on an exposed surface of a polymeric material that provides a high energy surface, which is adhered to a polymeric substrate.

One example of a polymeric material that provides what is referred to as a "high energy surface" is amorphous nylon. It is believed that the surface of an amorphous nylon layer facilitates the adhesion of the vapor deposited coating thereto, which in turn results in a better quality coating. Particularly, the exposed surface of the amorphous nylon layer exhibits a high "wettability" or surface energy in comparison to other polymers. The wettability of a polymer is believed to affect the ability of material to intimately contact another material. Thus, it is believed that the high wettability of the amorphous nylon skin layer facilitates the vapor deposition of a better quality barrier coating than can be achieved by directly coating the underlying polymeric substrate.

In this regard, it has been demonstrated herein that the application of a polymeric layer having a high energy surface (e.g., amorphous nylon) to a polymeric substrate greatly reduces the time required to deposit a barrier coating via vapor deposition, and more specifically, PECVD. The high energy surface enables a reduction in the coating time while maintaining barrier characteristics comparable to the prior art films.

The use of a high energy surface (e.g., amorphous nylon) also facilitates the production of a barrier film having increased or improved barrier characteristics if the coating time period remains the same. In other words, one of ordinary skill in the art can keep the coating time period at a constant and obtain a multilayer polymeric film with increased barrier characteristics. The effect of utilizing a high energy surface has also been observed to become more pronounced during short coating times, e.g., at coating rate of eight feet per minute (FPM) versus four FPM. This is believed to be due to the overall barrier characteristics exhibited by the film depending more on the quality of the coating than the quantity of the coating material applied.

The amorphous nylon employed in the present invention is preferably an amorphous co-polyamide synthesized from hexamethylenediamine and a mixture of isophthalic and terephthalic acids. One such commercially available product is Dupont PA-3426. By reference to an amorphous nylon, a nylon polymer that is substantially 100% amorphous is contemplated. This can easily be ascertained by Differential Scanning Calorimetry (DSC) because the polymer should not exhibit any peaks that correspond to a crystalline region. However, it is also contemplated that blends of amorphous nylon with semi-crystalline nylons can be utilized as long as the blend exhibits a wettability comparable to that of the amorphous nylon.

The amorphous nylon layer can be adhered to the substrate by a variety of techniques known in the art. For example, the nylon layer can be laminated onto a polymeric substrate by use of an adhesive. One particularly preferred method of securing a nylon layer to a polymeric substrate is accomplished by co-extruding a polymeric material with amorphous nylon, thereby providing a polymeric substrate having a layer of amorphous nylon on at least one side. Typically, a tie layer is employed to adhere the amorphous nylon to the polymeric substrate. For example, a material such as maleic anhydride modified polypropylene can be employed as the tie layer. One such commercially available product is Atmer QF-500A.

It is also contemplated that other polymers exhibiting a similar wettability to that of amorphous nylon would also be effective in providing a high energy surface for receipt of a barrier coating by vapor deposition.

One material that has been found to exhibit a wettability similar to that of amorphous nylon is an ethylene vinyl alcohol copolymer (EVOH). As demonstrated herein, an EVOH skin layer on a polymeric substrate facilitates the deposition of a barrier coating comparable to the those produced utilizing an amorphous nylon skin layer. The EVOH resin employed is preferably a resin having a mole percent ratio of ethylene to vinyl alcohol ranging from about 29:71 to about 48:52. More preferred is an EVOH resin having a mole percent ratio ranging from about 44:56 to about 48:52. EVOH resins that can be utilized in accordance to the present invention are readily available from Kuraray Co., Ltd. and Nippon Gohsei, both of Japan, and from EVAL Co., of America. One such preferred EVOH resin is a 48 mole percent resin, ECG-156B, produced by EVAL Co., of America.

As with the amorphous nylon layer, the EVOH layer can be adhered to the substrate by a variety of techniques known in the art. For example, the EVOH layer can be laminated onto a polymeric substrate by use of an adhesive. One particularly preferred method of securing a EVOH layer to the polymeric substrate is by coextrusion. Thus, a polymeric substrate having an exposed surface of an EVOH layer on one side is produced. A tie layer, such as those employed with the amorphous nylon layer, can also be employed to adhere the EVOH layer to the polymeric substrate.

Examples of polymeric substrates to be utilized in accordance with the present invention include, but are not limited to, polypropylene, polyethylene, biaxial nylon and polyester. It is believed that other substrates can also be employed, as long as such substrates are compatible with the material exhibiting the high energy surface.

The present invention also provides a method for increasing the production rate of a barrier film. The method includes the steps of adhering a polymeric layer having at least one exposed high energy surface to a polymeric substrate and, thereafter vapor depositing a barrier coating on the exposed, high energy surface. Again, this polymeric layer is preferably an amorphous nylon or ethylene vinyl alcohol layer.

As described earlier, the barrier coating is formed by the vapor deposition of the barrier material. In accordance with the present invention, any material that can be vapor deposited and offer barrier properties can be utilized as the barrier coating. The barrier coating can be either an organic coating, such as a carbon coating, or an inorganic coating, such as an oxide coating. A preferred carbon coating is amorphous carbon, which is due in part to its barrier characteristics and ease of application. Preferred oxide coatings include oxides of silicon ($SiO_x$, in which $1 \leq x \leq 2$) and of aluminum ($Al_2O_3$). Moreover, mixtures of various coatings can also be utilized, e.g., $SiO_x$, in which $1 \leq x \leq 2$, and $Al_2O_3$.

Any vapor deposition technique can be utilized in accordance with the present invention, provided that the reaction chamber temperatures are not detrimental to the substrate being coated. Preferably, a CVD process is utilized because of the temperature sensitive nature of the polymeric materials. PECVD is most preferred because the reaction chamber temperatures are usually well below the melting points of the contemplated polymeric materials to be utilized as the substrate. This is due in part due to the low temperature plasma that is formed during the PECVD coating process.

PVD techniques usually require reaction chamber temperatures above the melting points of the contemplated polymeric substrates and, as a result, should normally be avoided. However, if the reaction chamber temperatures can be kept at a temperature that is not detrimental to the polymeric substrate, the PVD technique can of course be utilized in accordance with the present invention.

As will be apparent to those skilled in the art, the source material for the barrier coating is dependent on the type of vapor deposition process utilized. In PVD processes the source material is usually the same chemical specie that is being deposited as the barrier coating. For example, a solid $SiO_x$ source is placed within reaction chamber to be vaporized and is thereafter deposited as a $SiO_x$ coating on the substrate.

In CVD processes, which are preferred, the source material is not the same chemical specie that is being deposited as the coating. For example, gaseous reactants such as hexamethyldisiloxane (HMDSO) and oxygen ($O_2$) are placed in the reaction chamber to react and thereafter provide a $SiO_x$ coating on the substrate. Thus, the main gaseous reactant, e.g., HMDSO, decomposes to form the desired coating on the substrate.

Because CVD coating processes are preferred, the source material for the barrier coating is preferably a gaseous reactant or a mixture of gaseous reactants. Alternatively, non-gaseous source materials can be utilized provided that they can be transformed to a gaseous state, e.g., vaporized or sublimed.

The deposition of an amorphous carbon coating requires a carbon source as the gaseous reactant. Preferably, the gaseous reactant is a hydrocarbon having from about 1 to 20 carbon atoms. Acetylene is one such preferred gaseous reactant.

Similarly, the deposition of a $SiO_x$ coating, in which $1 \leq x \leq 2$, requires a silicon-containing compound and an oxidizing agent as the gaseous reactants. Examples of these silicon-containing compounds include, but are not limited to, silanes, siloxanes and silanols. Hexamethydisiloxane and tetraethoxylsilane (TEOS) are two such preferred gaseous reactants. Oxidizing agents include, but are not limited, molecular oxygen ($O_2$) and nitrous oxide ($N_2O$). However, other sources for atomic oxygen can be readily utilized.

The deposition of an aluminum oxide coating requires an aluminum-containing compound and an oxidizing agent. An example of an aluminum-containing compound is aluminum chloride ($AlCl_3$). The oxidizing agents can be the same as previously described for the deposition of an $SiO_x$ coating.

Overall, once a particular barrier coating has been selected, one of ordinary skill in the art can easily be ascertain the gaseous reactants required to vapor deposit the barrier coating.

Upon the introduction of the gaseous reactant to the reaction chamber, the main gaseous reactant decomposes or reacts with other gaseous reactants and is thereafter deposited on the exposed high energy surface as a barrier coating. This coating may range in thickness from about 10 to about 5000 angstroms. Preferably, the coating is from about 100 to about 2000 angstroms. The thickness of the coating will be primarily dependent on the amount of time allowed for deposition.

The plasma utilized with the present invention is preferably generated by the application of a primary radio frequency to a first electrode. This radio frequency excites the gas mixture flowing through the chamber, thereby forming a plasma. This gas mixture is preferably a mixture of the gaseous reactants mentioned above, e.g., acetylene or TEOS and oxygen, and an inert or noble gas such as argon or helium.

Apparatuses adapted for vapor deposition, and more specifically PECVD, are well known and commercially available. Such apparatuses generally include a chamber sized for receipt of a substrate. The apparatus additionally includes a vacuum pump for evacuating the chamber, means for introducing a gas mixture to the chamber under controlled conditions, and means for generating a plasma within the chamber.

In one particularly preferred embodiment, the plasma generation means includes distally spaced first and second electrodes, which together can be employed to introduce independent dual energy sources into the reaction chamber. A primary radio frequency of about 13.56 MHZ is applied to the first electrode and a secondary radio frequency of about between 90 KHz to 450 KHz is applied to the second electrode. Preferably, the chamber serves as the ground for both radio frequencies.

The primary frequency generates the plasma (by exciting the gas mixture), while the secondary frequency is believed to facilitate the deposition of the carbon on the high energy surface by exciting the molecules of the coating material being deposited. This rationale is supported by the fact that a visible change in the plasma is observed upon application of this second radio frequency.

Other means of generating the plasma are also contemplated. For example, a primary frequency in the microwave range, e.g., about 2.45 GHz, can also be utilized. In addition, photometric means such as lasers can be employed to excite the gas mixture. Magnets can also be utilized to aid in directing the coating material to the substrate.

The chamber also includes a substrate holder plate for supporting the polymeric substrate to be coated. This substrate holder plate is preferably integral with the second electrode. In addition, the substrate holder plate may include either a flat or an arcuate support surface. It is contemplated that the use of an arcuate support surface would facilitate commercial production of the present invention.

EXAMPLE 1

Two amorphous carbon coated control films were produced. A 1 mil thick oriented polypropylene film approximately 11" long by 15.5" wide was placed on a 10" long by 15.5" wide substrate holder plate attached to the second electrode. The substrate holder plate included an arcuate surface having a 40" radius of curvature. The film overhung the substrate holder plate along the length of such film to allow the film to be secured to the holder.

The chamber was pumped down to about 1 mTorr. An acetylene/argon gas mixture was then introduced into the chamber at a flow rate of 100 sccm, 70% of the mixture being acetylene. The pressure within the chamber was increased to a reaction pressure of about 100 mTorr by use of a gate valve located at the inlet of the vacuum pump. A primary frequency of 13.5 MHZ at a power level of 100 watts was applied to the first electrode and a secondary frequency of 95 kHz at a power level of 25 watts was applied to the second electrode.

The substrate was coated for approximately 300 seconds. Thereafter, the gas mixture was shut off and the chamber was pumped down again to about 1 mTorr. The chamber vacuum was then broken by bleeding in dry nitrogen gas and the respective coated substrate was removed.

The two control films were thereafter tested. The first control film exhibited an oxygen transmission rate ($TgO_2$) of 0.4 cc $O_2$/100 $in^2$/atm/24 hr at 23° C. and 0% relative humidity and a water vapor transmission rate (WVTR) of 0.02 g $H_2O$/100 $in^2$/atm/24 hr at 100° F. and 90% relative humidity. The second control film exhibited an oxygen transmission rate of 0.6 cc $O_2$/100 $in^2$/atm/24 hr at 23° C. and 0% relative humidity and a water vapor transmission rate of 0.09 g $H_2O$/100 $in^2$/atm/24 hr at 100° F. and 90% relative humidity.

Accordingly, the average control oxygen transmission rate was 0.5 cc $O_2$/100 $in^2$/atm/24 hr at 23° C. and 0% relative humidity and the average control water vapor transmission rate was 0.055 g $H_2O$/100 $in^2$/atm/24 hr at 100° F. and 90% relative humidity.

EXAMPLE 2

Amorphous carbon coated barrier films in accordance with the present invention were produced utilizing a base sheet formed by co-extruding amorphous nylon with polypropylene that was subsequently biaxially oriented. Resin pellets of Dupont nylon PA-3426 were employed, along with a tie layer of Atmer QF-500A. The oriented film was approximately 1 mil thick, the amorphous nylon layer representing approximately 6% or 0.06 mils of the total film thickness.

A polymeric sample approximately 11" long by 15.5" wide was placed on the substrate holder plate attached to the second electrode and described above in Example 1.

The chamber was pumped down to about 1 mTorr. An acetylene/argon gas mixture was then introduced into the chamber at a flow rate of 60 sccm, approximately 83% of the mixture being acetylene. The pressure within the chamber was increased to a reaction pressure of about 100 mTorr by use of a gate valve located at the inlet of the vacuum pump. A primary frequency of 13.5 MHZ at a power level of 100 watts was applied to the first electrode and a secondary frequency of 95 kHz at a power level of 25 watts was applied to the second electrode.

The substrate was coated for approximately 60 seconds. Thereafter, the gas mixture was shut off and the chamber was pumped down again to about 1 mTorr. The chamber vacuum was then broken by bleeding in dry nitrogen gas and the respective coated substrate was removed.

The polymeric sample was thereafter tested. The sample film exhibited an oxygen transmission rate of 0.42 cc $O_2$/100 in$^2$/atm/24 hr at 23° C. and 0% relative humidity and a water vapor transmission rate of 0.024 g $H_2O$/100 in$^2$/atm/24 hr at 100° F. and 90% relative humidity.

Additional polymeric samples were prepared under varying test conditions. The measured results from all of the polymeric samples, i.e., samples 1–8, are set forth in Table 1:

EXAMPLE 4

A $SiO_x$ coated film in accordance with the present invention was produced, in which $1 \leq x \leq 2$, utilizing the stock amorphous nylon-OPP film material described in Example 2. The reaction parameters and coating time were identical to those utilized in Example 3. After the coating process, samples from the film were thereafter tested for oxygen and water vapor transmission. The $SiO_x$ coated film exhibited an oxygen transmission rate of 0.13 cc/100 in$^2$/atm/24 hr, and a water vapor transmission rate of 0.07 g/100 in$^2$/atm/24 hr.

From the results in Examples 3 and 4, it is readily apparent that the use of a high energy surface, such as that provided by the amorphous nylon layer, is applicable to other vapor deposited coatings, such as inorganic oxides. In particular, the oxygen permeability of the barrier film decreased by a factor of 10 through the use of the amorphous nylon skin. The $SiO_x$ coated OPP film in Example 3 exhibited an oxygen transmission rate of 1.54 cc/100 in$^2$/atm/24 hr. While on the other hand, the $SiO_x$ coated amorphous nylon-OPP film in Example 4 exhibited an oxygen transmission rate of 0.13 g/100 in$^2$/atm/24 hr. Accordingly, Examples 3 and 4 illustrate that when reaction parameters are kept at a constant, barrier films with increased barrier characteristics are obtained.

The results from Examples 3 and 4 also illustrate the synergistic effect produced by the high energy surface of the amorphous nylon layer. This effect is seen by comparing the

TABLE 1

| SAMPLES | TO$_2$ | WVTR | PRESSURE (mTorr) | FLOW C2H2 | FLOW Ar | PRIMARY POWER (watts) | SECONDARY POWER (watts) | TIME (sec.) |
|---|---|---|---|---|---|---|---|---|
| Control 1 | 0.4 | 0.02 | 100 | 70 | 30 | 100 | 25 | 300 |
| Control 2 | 0.6 | 0.09 | 100 | 70 | 30 | 100 | 25 | 300 |
| Sample 1 | 0.42 | 0.024 | 100 | 50 | 10 | 100 | 25 | 60 |
| Sample 2 | 0.18 | 0.005 | 100 | 50 | 10 | 50 | 25 | 60 |
| Sample 3 | 0.11 | 0.015 | 100 | 50 | 10 | 75 | 25 | 60 |
| Sample 4 | 0.10 | 0.024 | 100 | 50 | 10 | 75 | 25 | 45 |
| Sample 5 | 0.18 | 0.020 | 100 | 50 | 10 | 75 | 25 | 30 |
| Sample 6 | 0.26 | 0.062 | 100 | 50 | 10 | 75 | 25 | 15 |
| Sample 7 | 0.07 | 0.036 | 150 | 50 | 10 | 75 | 25 | 30 |
| Sample 8 | 0.09 | 0.051 | 100 | 50 | 10 | 50 | 25 | 30 |

TO$_2$: cc/100 in$^2$/atm/24 hr at 23° C. and 0% R.H.
WVTR: g/100 in$^2$/atm/24 hr at 100° F. and 90% R.H.
FLOW: Standard cubic centimeter (sccm)

It is readily apparent from the test data set forth above that a barrier film can be produced by the deposition of carbon on an exposed high energy surface of an amorphous nylon layer. It is particularly significant that the rate of producing such a barrier film can be increased by approximately a factor of 10, i.e., the coating time is decreased from approximately 300 seconds to about 15 to 60 seconds. It is also significant that the resultant film exhibits a markedly decreased oxygen transmission rate, while improving, or at the minimum maintaining, the level of water transmission.

EXAMPLE 3

A $SiO_x$ control film was produced, in which $1 \leq x \leq 2$, utilizing the stock 1 mil OPP film material described in Example 1. After the coating process, samples from the film were thereafter tested for oxygen and water vapor transmission. The $SiO_x$ coated film exhibited an oxygen transmission rate of 1.54 cc/100 in$^2$/atm/24 hr at 23° C. and 0% relative humidity (hereinafter cc/100 in$^2$/atm/24 hr), and a water vapor transmission rate of 0.06 g/100 in$^2$/atm/24 hr at 100° F. and 90% relative humidity (hereinafter g/100 in$^2$/atm/24 hr).

magnitudes of reduction in the oxygen transmission rates for the OPP film versus the amorphous nylon-OPP film. The stock OPP film has an oxygen transmission rate of 100 cc/100 in$^2$/atm/24 hr, which was reduced to 1.54 cc/100in$^2$/atm/24 hr after the application of the $SiO_x$ coating. The stock amorphous nylon-OPP film has an oxygen transmission rate of 50.5 cc/100 in$^2$/atm/24 hr, which was reduced to 0.13 cc/100 in$^2$/atm/24 hr after the application of the $SiO_x$ coating. Stated otherwise, the OPP film exhibited approximately a 65-fold reduction in its oxygen transmission rate. The amorphous nylon-OPP film exhibited approximately a 388-fold reduction in its oxygen transmission rate. Thus, the high energy surface of the amorphous nylon layer facilitated the deposition of a barrier coating approximately 600% less permeable than could be achieved by directly coating the underlying polymeric material.

EXAMPLE 5

Amorphous carbon coated control films were produced utilizing the stock amorphous nylon-OPP material described in Example 2 to provide a standard for the EVOH embodiment of the present invention. Overall, two sets of four films samples were coated with an amorphous carbon coating following the procedure of Example 2. One set of the amorphous nylon-OPP samples were coated for approximately 22.5 seconds. The other set of amorphous nylon-OPP samples were coated for approximately 11.25 seconds.

The samples were thereafter tested for oxygen and water vapor transmission. The samples coated for 22.5 seconds on average exhibited an average oxygen transmission rate of 0.070 cc/100 in$^2$/atm/24 hr, and an average water vapor transmission rate of 0.015 g/100 in$^2$/atm/24 hr. The samples coated at 11.25 seconds exhibited an average oxygen transmission rate of 0.210 cc/100 in$^2$/atm/24 hr, and an average water transmission rate of 0.100 g/100 in$^2$/atm/24 hr.

EXAMPLE 6

Amorphous carbon coated films in accordance with the EVOH embodiment of the present invention were produced by coextruding an EVOH resin with polypropylene to form a base sheet that was subsequently biaxially oriented. Resin pellets of EVAL EVOH resin, ECG-156b, were employed along with a tie layer of Atmer QF-500A. The oriented film was approximately 1 mil thick, in which the EVOH layer represented approximately 6% or 0.06 mils of the total film thickness. Overall, two sets of four film samples of the EVOH-OPP film were coated with an amorphous carbon coating. The reaction parameters were identical to those utilized in Example 5. As in Example 5, the two sets of samples were coated for 22.5 and 11.25 seconds, respectively.

The polymeric samples were thereafter tested. The samples coated for 22.5 seconds exhibited an average oxygen transmission rate of 0.020 cc/100 in$^2$/atm/24 hr, and an average water vapor transmission rate of 0.013 g/100 in$^2$/atm/24 hr. The samples coated for 11.25 seconds exhibited an average oxygen transmission rate of 0.190 cc/100 in$^2$/atm/24 hr, and an average water vapor transmission rate of 0.160 g/100 in$^2$/atm/24 hr.

As can be seen from the results in Examples 5 and 6 the EVOH-OPP films coated with amorphous carbon provided barrier properties comparable, if not better than, the amorphous nylon-OPP samples. For example, the oxygen transmission rate for the coated EVOH-OPP films were in fact better than the oxygen transmission rates of the amorphous nylon-OPP films. The amorphous nylon-OPP films exhibited an average oxygen transmission rate of 0.070 and 0.210 cc/100 in$^2$/atm/24 hr, after the coating time periods of 22.5 and 11.25 seconds, respectively. The EVOH-OPP films exhibited an average oxygen transmission rate of 0.020 and 0.190 cc/100 in$^2$/atm/24 hr, after the coating time periods of 22.5 and 11.25 seconds, respectively. Therefore, the results of Examples 5 and 6 illustrate that EVOH resins can also be utilized in accordance with the present invention.

While there have been described what are presently believed to be the preferred embodiments of the invention, those skilled in the art will realize that various changes and modifications may be made to the invention without departing from the spirit of such invention. All such changes and modifications which fall within the scope of the invention are therefore intended to be claimed.

What is claimed is:

1. A method for producing a polymeric film having barrier characteristics, which comprises:
    vapor depositing a barrier coating on an exposed surface of an ethylene vinyl alcohol copolymer layer, wherein said ethylene vinyl alcohol copolymer layer is adhered to a polymeric substrate.

2. The method according to claim 1, wherein said polymeric substrate is formed of a material selected from the group consisting of polypropylene, biaxial nylon, polyester and polyethylene.

3. The method according to claim 1, wherein said barrier coating is selected from the group consisting of organic coatings and inorganic coatings.

4. The method according to claim 3, wherein said inorganic coating is an inorganic oxide coating.

5. The method according to claim 4, wherein said inorganic oxide coating is selected from the group consisting of $SiO_x$, wherein x is $1 \leq x \leq 2$, $Al_2O_3$ and mixtures thereof.

6. The method according to claim 3, wherein said organic coating is an amorphous carbon coating.

7. A method for increasing the production rate of a polymeric film having barrier characteristics, which comprises:
    adhering an ethylene vinyl alcohol copolymer layer to a polymeric substrate, thereby providing a surface of said ethylene vinyl alcohol copolymer layer exposed for receipt of a barrier coating; and thereafter,
    vapor depositing said barrier coating on said exposed surface of said ethylene vinyl alcohol copolymer layer.

8. The method according to claim 7, wherein said ethylene vinyl alcohol copolymer layer is co-extruded with said polymeric substrate.

9. The method according to claim 7, wherein said polymeric substrate is formed of a material selected from the group consisting of polypropylene, biaxial nylon, polyester and polyethylene.

10. The method according to claim 7, wherein said barrier coating is selected from the group consisting of organic coatings and inorganic coatings.

11. The method according to claim 10, wherein said inorganic coating is an inorganic oxide coating.

12. The method according to claim 11, wherein said inorganic oxide coating is selected from the group consisting of $SiO_x$, wherein x is $1 \leq x \leq 2$, $Al_2O_3$ and mixtures thereof.

13. The method according to claim 7, wherein said organic coating is an amorphous carbon coating.

* * * * *